(12) United States Patent  (10) Patent No.: US 7,825,448 B2
Okanishi et al.  (45) Date of Patent: Nov. 2, 2010

(54) U-SHAPED SONOS MEMORY HAVING AN ELEVATED SOURCE AND DRAIN

(75) Inventors: Masatomi Okanishi, Fukushima-Ken (JP); Yoshihiro Mikasa, Fukushima-Ken (JP); Hiroshi Murai, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 74 days.

(21) Appl. No.: 12/192,945

(22) Filed: Aug. 15, 2008

(65) Prior Publication Data

US 2009/0200599 A1 Aug. 13, 2009

(30) Foreign Application Priority Data

Aug. 17, 2007 (JP) .............................. 2007-213000

(51) Int. Cl.
*H01L 27/108* (2006.01)

(52) U.S. Cl. .................................................... 257/299
(58) Field of Classification Search ....................... None
See application file for complete search history.

(56) References Cited

U.S. PATENT DOCUMENTS

| 4,792,834 A | * | 12/1988 | Uchida | ......................... 257/304 |
| 4,833,094 A | * | 5/1989 | Kenney | ......................... 438/243 |
| 5,181,089 A | * | 1/1993 | Matsuo et al. | ............... 257/299 |

* cited by examiner

*Primary Examiner*—Charles D Garber
*Assistant Examiner*—Andre' C Stevenson

(57) ABSTRACT

A semiconductor device and a method for manufacturing thereof are provided. The semiconductor device includes two epitaxial semiconductor layers formed on a semiconductor substrate, bit lines formed on upper portions of the two epitaxial semiconductor layers, and a charge storage layer formed on the semiconductor substrate between the two epitaxial semiconductor layers.

8 Claims, 16 Drawing Sheets

A-A

B-B

C-C

D-D

A

B

C

D

U-SHAPED SONOS MEMORY HAVING AN ELEVATED SOURCE AND DRAIN

CLAIM OF PRIORITY

This application claims priority from Japanese patent application 2007-213000 filed on Aug. 17, 2007.

TECHNICAL FIELD

The invention relates to a semiconductor device and a method for manufacturing thereof. More particularly, this invention relates to a semiconductor device having a bit line formed of a semiconductor epitaxially grown and a method for manufacturing thereof.

BACKGROUND OF THE INVENTION

Recently, the usage of non-volatile memory comprising a semiconductor device capable of rewriting data and retaining data stored therein even while the device is un-powered has become increasingly popular. Flash memory is one example of non-volatile memory. A typical flash memory is provided with a transistor which operates as a memory cell and includes a floating gate or an insulating film called a charge storage layer for accumulating electrons used to store data. Flash memory with a SONOS (Silicon Oxide Nitride Oxide Silicon) structure for accumulating the electrons in a trap layer of an ONO (Oxide Nitride Oxide) film has been introduced as a flash memory using an insulating film as the charge storage layer.

One example of a flash memory with a SONOS structure is a flash memory having a memory cell of virtual ground type for switching between the source and the drain so as to be symmetrically operated. This makes it possible to form two or more charge storage regions per one memory cell so as to record the data with 2 bits or more. In a flash memory according to this structure, the bit line is formed of a diffusion layer inside the semiconductor substrate, and the implantation dose amount is required to be increased for lowering the resistance of the bit line. However, if the implantation dose amount is increased, the dopant diffuses both in the lateral and longitudinal directions to reduce the channel length. In the case where a plurality of the charge storage regions are formed in a single memory cell, a channel of a certain length or longer is required to be kept for the purpose of separating the charge storage regions from each other. As a result, it is difficult for flash memory having this structure to miniaturize the memory cell while keeping the channel length.

Furthermore, flash memory having a memory cell of virtual ground type for switching between the source and the drain so as to be symmetrically operated may include a bit line inside the semiconductor substrate as a diffusion layer. The effort to miniaturize the memory cell so as not to raise the bit line resistance may cause the bit line to be highly doped. For example, if the dose amount upon ion implantation is increased for highly doping the bit line, the bit line may be expanded in the lateral and the longitudinal directions. Accordingly, a channel length between the bit lines becomes short. It is not preferable to reduce the channel length because the charge storage regions become too close with each other. Accordingly, this structure has difficulties in miniaturization of the memory cell. Furthermore, because the bit line is formed inside the semiconductor substrate, a p-type density of the semiconductor substrate cannot be increased. The resistance of the bit line becomes high accompanied with the increase in the p-type density. So the p-type density of the channel cannot be increased, and accordingly, the threshold voltage is lowered.

SUMMARY OF THE INVENTION

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

It is an object of the invention to provide a semiconductor device with a bit line formed of a semiconductor which is capable of miniaturizing a memory cell.

According to an aspect of the present invention, there is provided a semiconductor device which includes two epitaxial semiconductor layers formed on a semiconductor substrate, bit lines formed on upper portions of the two epitaxial semiconductor layers, and a charge storage layer formed on the semiconductor substrate between the two epitaxial semiconductor layers. In the present invention, as the width of the bit line is substantially defined by the width of the epitaxial semiconductor layer, reduction in the channel length can be suppressed. This makes it possible to miniaturize the memory cell.

In one embodiment, a groove may be formed in the semiconductor substrate between the two epitaxial semiconductor layers, and the charge storage layer may be formed along an inner surface of the groove. This structure can suppress fluctuation of the channel length due to variation in the depth of the groove. Accordingly, it is possible to maintain the channel length while miniaturizing the memory cell. In a further embodiment, each of the two epitaxial semiconductor layers may be entirely formed as a bit line. Furthermore, the charge storage layer may also be formed on each side of the two epitaxial semiconductor layers.

According to another aspect of the present invention, there is provided a method for manufacturing a semiconductor device comprising: forming a charge storage layer on a region of a semiconductor substrate corresponding to an area between two epitaxial semiconductor layers, forming the two epitaxial semiconductor layers on the semiconductor substrate, and forming a bit line on each upper portion inside the two epitaxial semiconductor layers. In the method, because the bit line width is substantially defined by the width of the epitaxial semiconductor layer, the reduction in the channel length can be suppressed. Accordingly, it is possible to miniaturize the memory cell.

In one embodiment, the method for manufacturing a semiconductor device may further comprise forming a groove in the region of the semiconductor substrate corresponding to the area between the two epitaxial semiconductor layers. The charge storage layer may be formed along an inner surface of the groove. According to this method, the memory cell can be miniaturized while maintaining the channel length.

In a further embodiment, the two epitaxial semiconductor layers may be formed using the charge storage layer as a mask to simplify the manufacturing step.

In a still further embodiment, the method for manufacturing a semiconductor device may further comprise forming a mask layer on a region corresponding to the area between the two epitaxial semiconductor layers. In this embodiment, forming the two epitaxial semiconductor layers, the two epitaxial semiconductor layers may be formed, for example, by using the mask layer as a mask. In a further embodiment, the two epitaxial semiconductor layers may be formed to have one or more upper surfaces lower than that of the mask layer. Accordingly, this method allows the angle of the side surface of the epitaxial semiconductor layer to be defined to a desired value.

In alternate embodiments, forming the two epitaxial semiconductor layers, the two epitaxial semiconductor layers may be formed to have one or more upper surfaces higher than that of the mask layer. In a further embodiment, the method for manufacturing a semiconductor device may further comprise polishing the two epitaxial semiconductor layers to be in the same plane with the mask layer.

According to the present invention, because the width of the bit line is substantially defined by the width of the epitaxial semiconductor layer, reduction in the channel length can be suppressed. This makes it possible to miniaturize the memory cell.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, and components, have not been described in detail as not to unnecessarily obscure aspects and features of the subject matter.

Figure 1A:
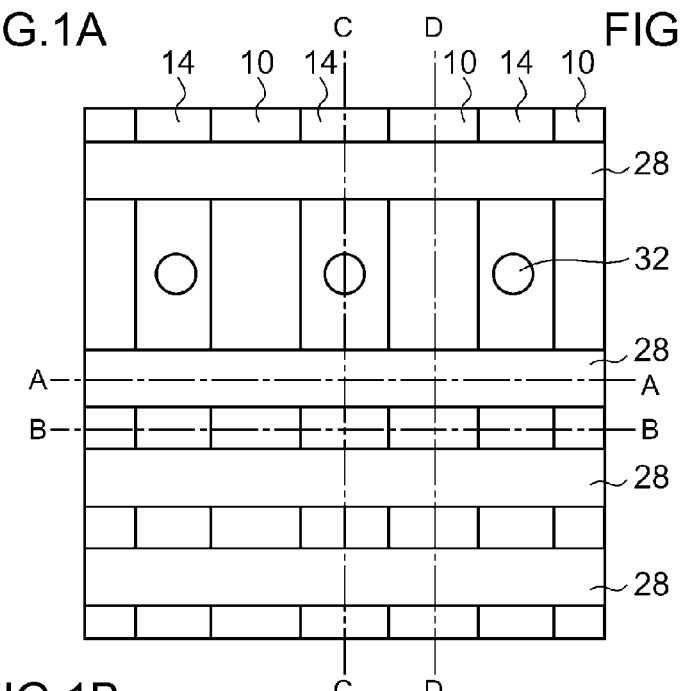
FIG. 1A is a top view of a flash memory according to a first embodiment.
Figure 1B:
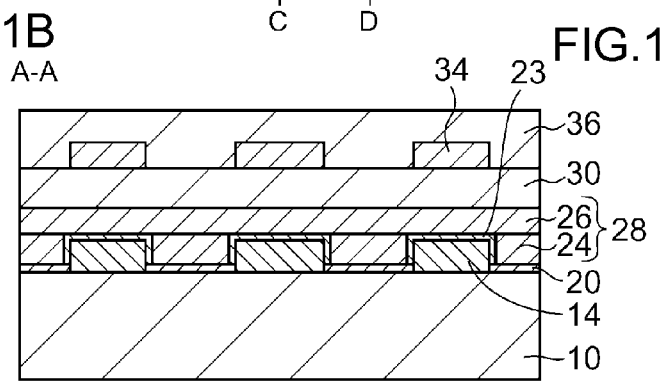
FIGS. 1B to 1E are sectional views taken along the lines A-A to D-D shown in FIG. 1A, respectively.
Figure 1C:
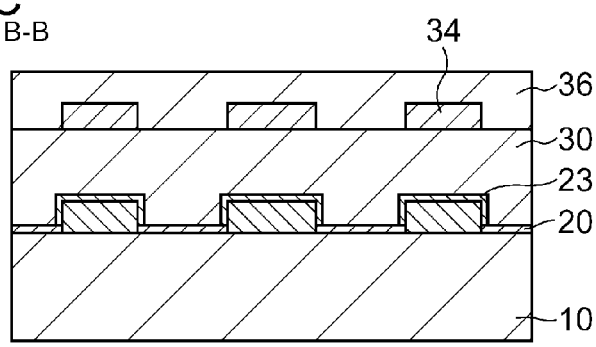

FIG. 1A is a top view of a flash memory according to one embodiment (an interlayer insulation film 30, a wiring layer 34 and a protection layer 36 are not shown). FIGS. 1B to 1E are sectional views taken along lines A-A to D-D respectively, as shown in FIG. 1A. Referring to FIG. 1A, bit lines 14 each formed of an epitaxial semiconductor layer extend on a semiconductor substrate 10. Word lines 28 intersect with the bit lines 14. Bit line 14 is coupled to a plug metal 32 as it passes across the plurality of word lines 28.

Figure 1D:
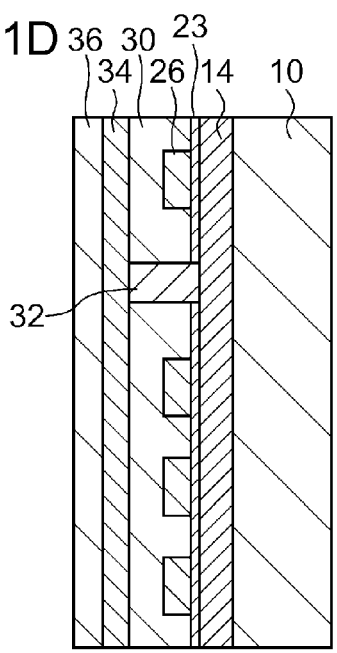
Figure 1E:
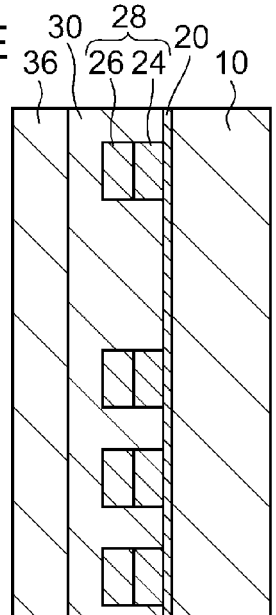

Referring to FIGS. 1B to 1E, an ONO film 20 having a trap layer as a charge storage layer is formed on the semiconductor substrate 10 (expected to become a channel) between the bit lines 14 each formed from the epitaxial semiconductor layer. A top oxide film 23 is formed to coat the bit lines 14. Referring to FIGS. 1B to 1E, a first polysilicon layer 24 is formed on the ONO film 20 between the bit lines 14, and a second polysilicon layer 26 is further formed on the first polysilicon layer 24 and the bit lines 14. The word line 28 is formed of the first and the second polysilicon layers 24 and 26. As shown in FIGS. 1B to 1E, the interlayer insulation film 30 is formed on the word lines 28 and the bit lines 14. The wiring layer 34 is formed on the interlayer insulation film 30 along the direction of the extension of the bit line 14. A protection film 36 is provided to coat the wiring layer 34. Referring to FIG. 1D, the wiring layer 34 is coupled to the bit line 14 via the plug metal 32.

Figure 2A:
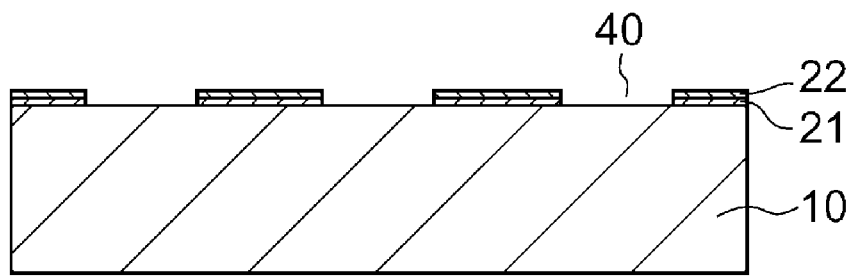
FIGS. 2A to 2D are sectional views taken along line A-A shown in FIG. 1A showing manufacturing steps of the flash memory (part 1) according to the first embodiment.

With reference to FIGS. 2A to 3B, a method for manufacturing the semiconductor device according to one embodiment will be described. As FIG. 2A shows, a tunnel oxide film 21 is applied as a silicon oxide onto the p-type silicon semiconductor substrate (or a p-type region in the silicon semiconductor substrate) 10 through a thermal oxidation process. A trap layer 22 is applied as a silicon nitride onto the tunnel oxide film 21 through a plasma CVD (Chemical Vapor Deposition) process. The trap layer 22 and the tunnel oxide film 21 on a region 40 to be formed as the epitaxial semiconductor layer are eliminated through etching. As a result, the trap layer 22 is formed as the charge storage layer on the semiconductor substrate 10 between the epitaxial semiconductor layers. Referring to FIG. 2B, an undoped single crystal epitaxial semiconductor layer 15 with a film thickness of 100 nm is formed on the semiconductor substrate 10 using the trap layer 22 as a mask.

Figure 2B:
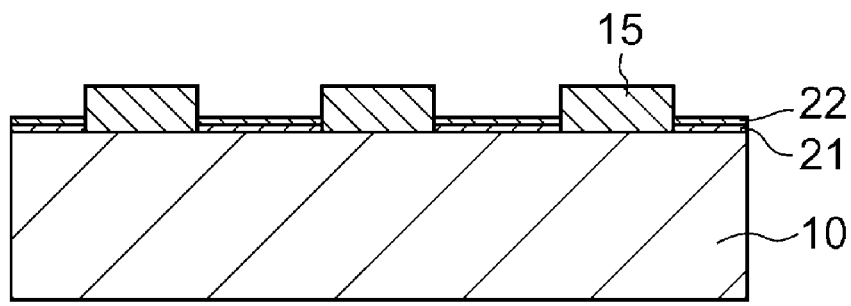
Figure 2C:
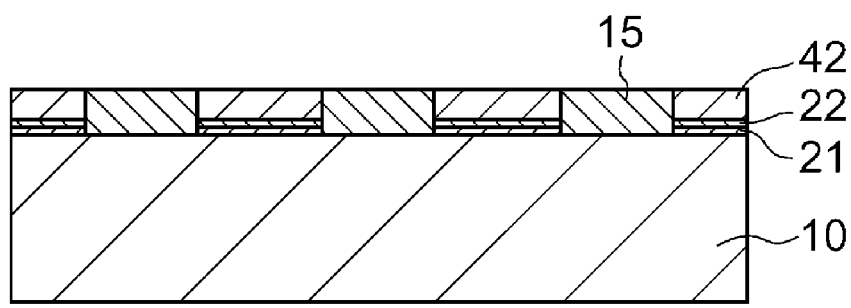
Figure 2D:
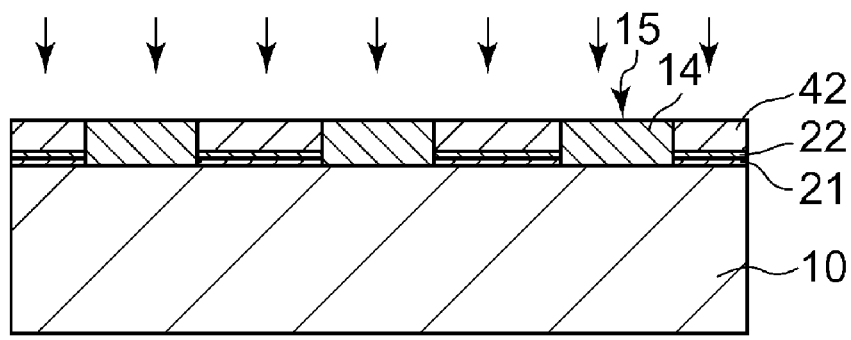
Figure 3:
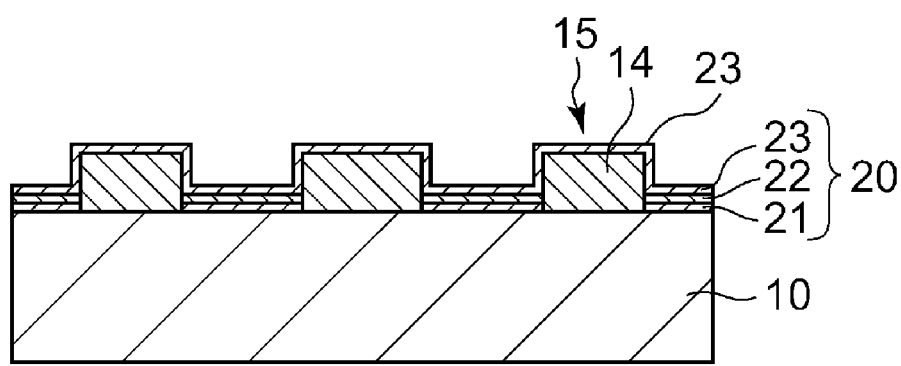
FIGS. 3A and 3B are sectional views taken along line A-A shown in FIG. 1A showing the manufacturing steps of the flash memory (part 2) according to the first embodiment.
Figure 3:
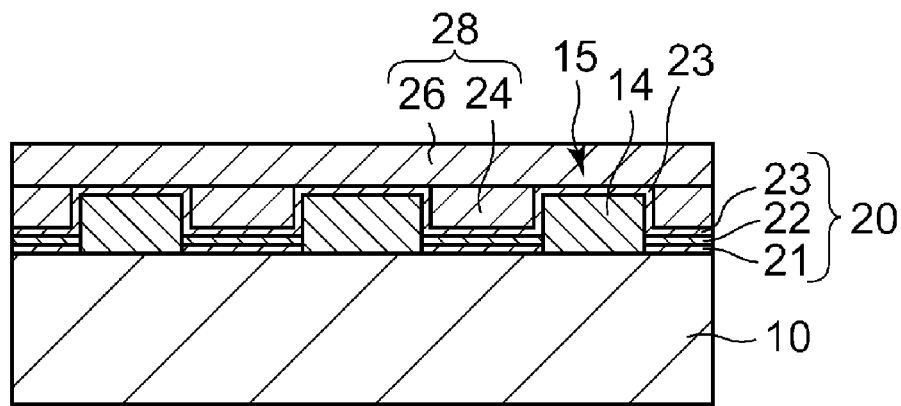

Referring to FIG. 2C, a polymer layer 42 is formed to coat the epitaxial semiconductor layer 15, and is polished until the epitaxial semiconductor layer 15 is exposed through a CMP (Chemical Mechanical Polish) process. Referring to FIG. 2D, the bit line 14 formed of an n-type diffusion layer is formed inside the epitaxial semiconductor layer 15 by As (arsenic) ion implantation. It is preferable to select the ion implantation conditions such that the epitaxial semiconductor layer 15 is substantially formed into the bit line 14 in order to electrically couple the bit line 14 with the channel.

The polymer layer 42 is eliminated as shown in FIG. 3A. The top oxide film 23 is formed as the silicon oxide on the trap layer 22 and the bit line 14 through, for example, the CVD process to coat the bit line 14. Meanwhile, the ONO film 20 formed of the tunnel oxide film 21, the trap layer 22 and the top oxide film 23 is formed on the semiconductor substrate 10 between the bit lines 14. The first polysilicon layer 24 is formed on the ONO film 20 between the bit lines 14 through the CVD and CMP processes as shown in FIG. 3B. Then, the second polysilicon layer 26 is further formed on the first polysilicon layer 24 and the bit lines 14. Predetermined regions of the first and second polysilicon layers 24 and 26 are eliminated so as to form a word line 28.

The interlayer insulation film 30 is formed as a silicon oxide. The plug metal 32 that is formed of tungsten and electrically coupled with the bit line 14 is formed inside the interlayer insulation film 30. The wiring layer 34 that is formed of aluminum or copper and coupled to the plug metal 32 is formed on the interlayer insulation film 30. Then, the protection film 36 as the silicon oxide is further formed. In this manner, production of the flash memory as shown in FIGS. 1A to 1E is completed.

Figure 4:
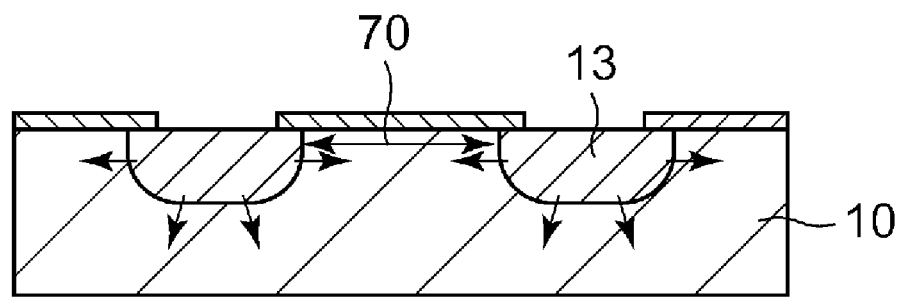
FIGS. 4A and 4B are explanatory views showing the effect derived from the first embodiment.
Figure 4:
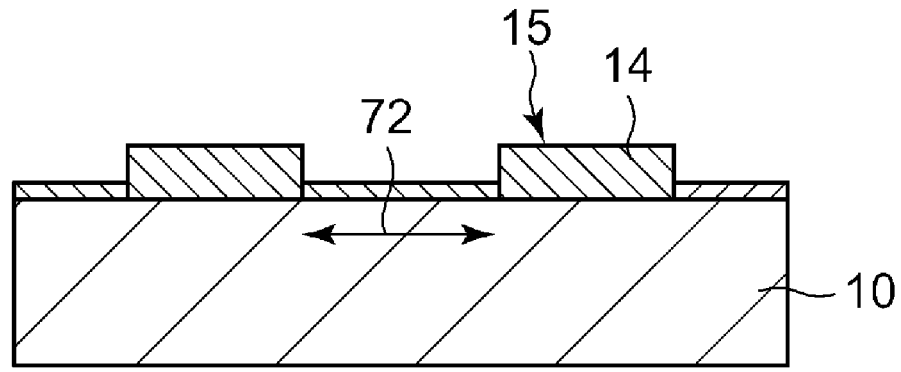

FIGS. 4A and 4B depict the effect derived from one embodiment. With reference to FIGS. 4A and 4B, the trap layer 22 is formed as the charge storage layer on the region of the semiconductor substrate 10 corresponding to the area between the two epitaxial semiconductor layers 15, as shown in FIG. 2A. As shown in FIG. 2B, the two epitaxial semiconductor layers 15 are formed on the semiconductor substrate 10. The bit line 14 is formed on each of the epitaxial semiconductor layers 15 as shown in FIG. 2D. Then the width of the bit line 14 is substantially defined by the width of the epitaxial semiconductor layer 15 as shown in FIG. 4B. This makes it possible to prevent a channel length 72 from being reduced, and accordingly, to allow the miniaturization of the memory cell. The bit line 14 is formed inside the epitaxial semiconductor layer 15 other than the semiconductor substrate 10. This makes it possible to independently select impurities from the semiconductor substrate 10 and the epitaxial semiconductor layer 15. For example, the p-type density of the semiconductor substrate 10 may be raised to a degree so as not to lower the threshold voltage, and p-type impurities are not added to the epitaxial semiconductor layer 15 so that the resistance of the bit line 14 is lowered.

In one embodiment, the epitaxial semiconductor layer 15 is substantially or entirely formed as the bit line 14. However, it is sufficient if at least the upper portion inside the epitaxial semiconductor layer 15 is formed into the bit line 14 in the range where the bit line 14 is electrically coupled with the channel. Preferably, the epitaxial semiconductor layer 15 is formed using the trap layer 22 as the mask as shown in FIG. 2B. This can simplify the manufacturing step by eliminating the need for forming a new mask layer.

As shown in FIG. 2C, a dummy layer such as the polymer layer 42 is formed between the epitaxial semiconductor layers 15, and the ion is implanted in the epitaxial semiconductor layers 15 as shown in FIG. 2D to form the bit line 14. The ion is allowed to be selectively implanted into the epitaxial semiconductor layer 15. Ss shown in FIG. 2A, the tunnel oxide film 21 and the trap layer 22 are formed on the region corresponding to the area between the epitaxial semiconductor layers, and the top oxide film 23 is formed on the bit line 14 as shown in FIG. 3A. Referring to FIG. 3B, the word line 28 is formed on the ONO film 20 and the bit line 14. As a result the top oxide film 23 may be used as a spacer between the bit line 14 and the word line 28, thus simplifying the manufacturing step.

Figure 5A:
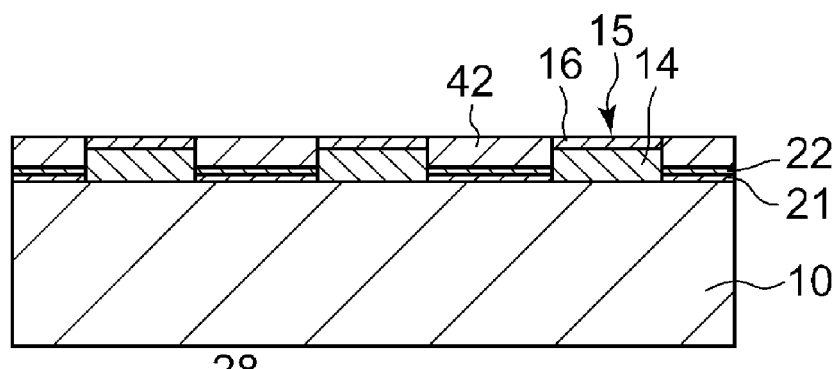
FIGS. 5A and 5B are sectional views taken along line A-A shown in FIG. 1A showing manufacturing steps of a flash memory according to a second embodiment.

In another embodiment, a silicide layer 16 is formed on the bit line 14. Referring to FIG. 5A, a metal layer of cobalt or titanium is formed on the polymer layer 42 and the bit line 14. Thereafter, a heat processing is performed to cause the reaction between the metal layer and the silicon to form the metal silicide layer 16. The unreacted metal layer on the polymer layer 42 is eliminated.

Figure 5B:
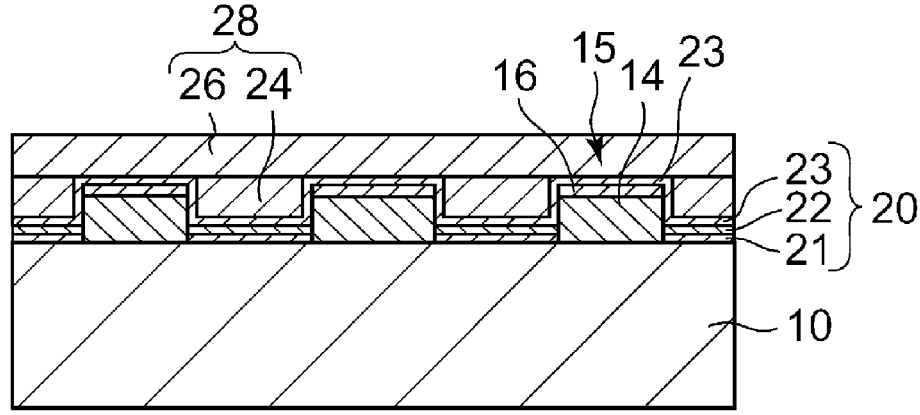

Referring to FIG. 5B, the top oxide film 23 and the word line 28 are formed in the same manner as shown in FIGS. 3A and 3B. This embodiment allows the silicide layer 16 to be sequentially formed along the direction of the extension of the bit line 14. As such, it is possible to reduce the resistance of the bit line over the entire extension of the bit line 14.

Figure 6:
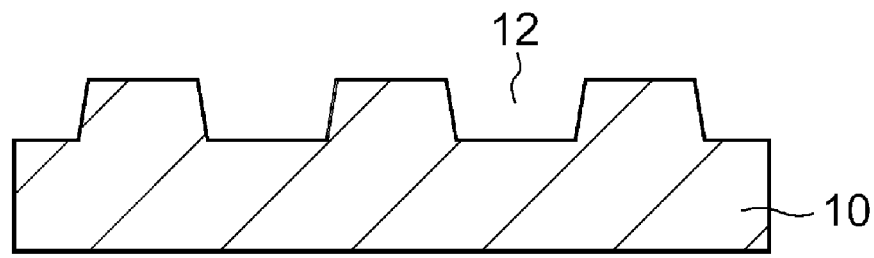
FIGS. 6A to 6D are sectional views taken along line A-A shown in FIG. 1A showing manufacturing steps of a flash memory (part 1) according to a third embodiment.
Figure 6:
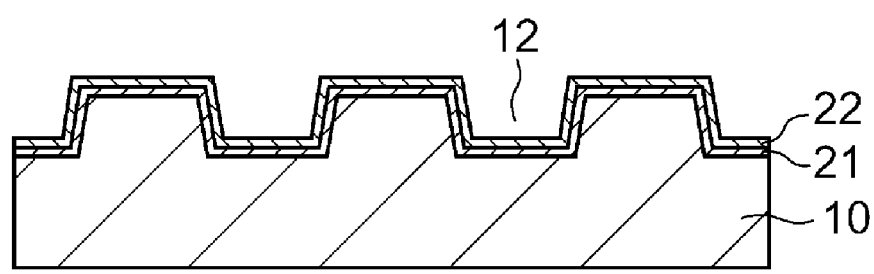
Figure 6:
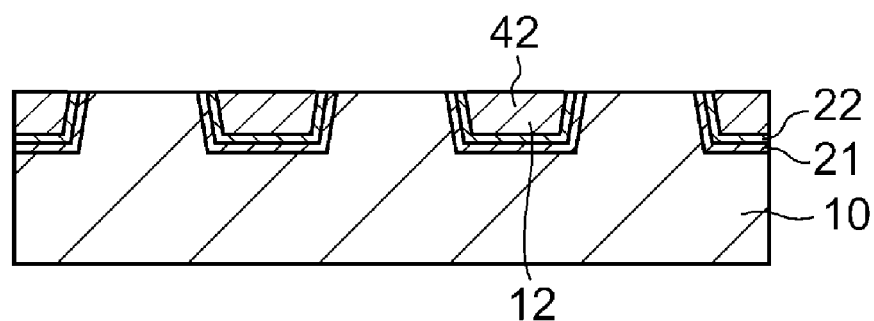
Figure 6:
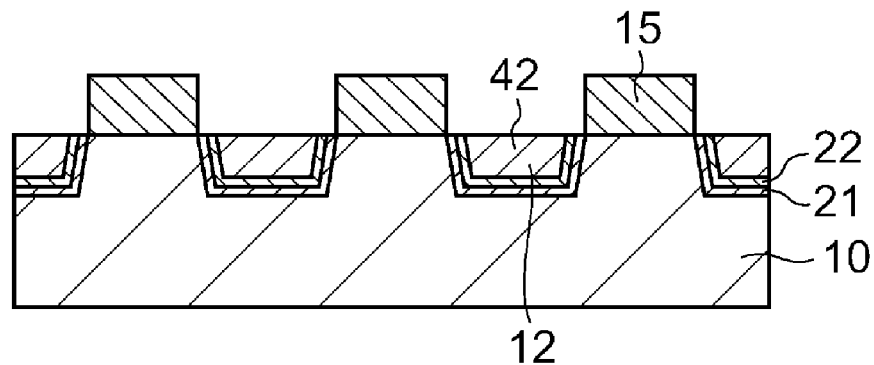

A further embodiment shows an example where a groove is formed in the semiconductor substrate 10. Referring to FIG. 6A, a groove 12 with a depth in the range from 20 to 50 nm extending in the direction of the extension of the bit line is formed in the region of the semiconductor substrate 10 corresponding to the area between the epitaxial semiconductor layers. As shown in FIG. 6B, the tunnel oxide film 21 and the trap layer 22 are formed on the semiconductor substrate 10 between the grooves 12. Thus, the tunnel oxide film 21 and the trap layer 22 are formed along the inner surface of the groove 12. Referring to FIG. 6C, the polymer layer 42 is formed to fill the groove 12, and is polished to expose the semiconductor substrate 10 between the grooves 12 through the CMP process. As shown in FIG. 6D, the epitaxial semiconductor layer 15 with a film thickness of approximately 100 nm is formed on the semiconductor substrate 10 between the grooves 12. Thus, the groove 12 is formed in the semiconductor substrate 10 between the epitaxial semiconductor layers 15, and the trap layer 22 is formed along the inner surface of the groove 12.

Figure 7:
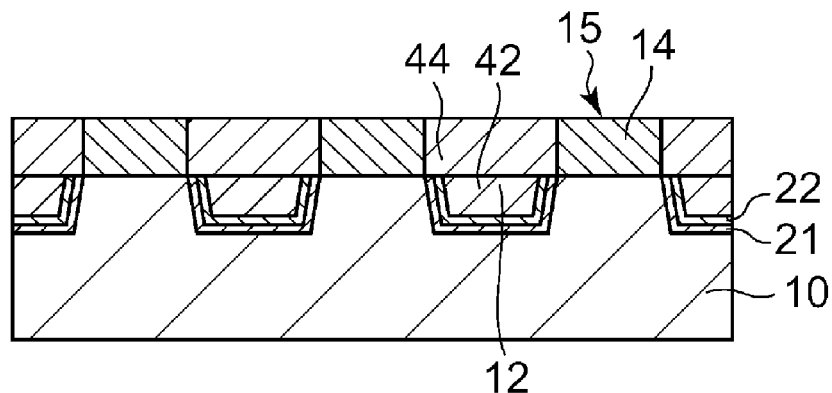
FIGS. 7A to 7C are sectional views taken along line A-A shown in FIG. 1A showing the manufacturing steps of the flash memory (part 2) according to the third embodiment.
Figure 7:
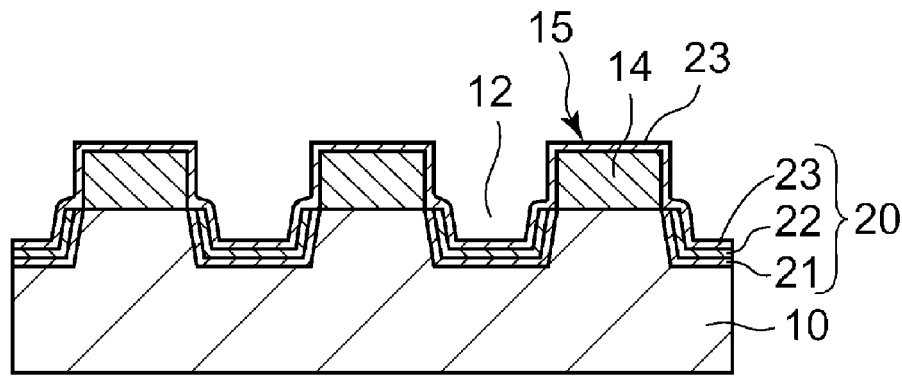
Figure 7:
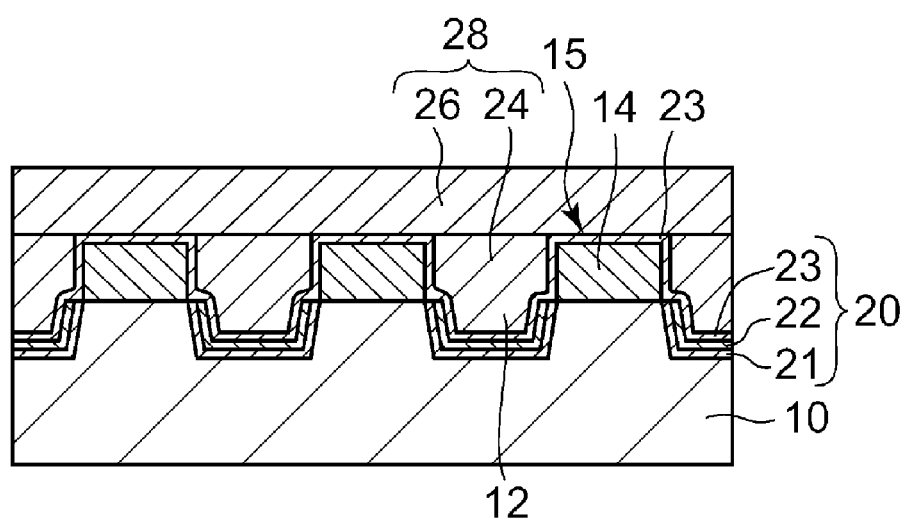

Referring to FIG. 7A, a polymer layer 44 is formed to fill the area between the epitaxial semiconductor layers 15, and is polished to expose the area between the epitaxial semiconductor layers 15 through the CMP process. The ion implantation into the epitaxial semiconductor layer 15 forms the bit line 14 as the diffusion layer. Referring to FIG. 7B, the polymer layers 42 and 44 are eliminated. The top oxide film 23 is formed to coat the trap layer 22 inside the groove 12 and the epitaxial semiconductor layer 15. Thus, the ONO film 20 is formed inside the groove 12. Likewise, as shown in FIG. 3B, the word line 28 is formed of the first and the second polysilicon layers 24 and 26 formed inside the groove 12 and the area between the epitaxial semiconductor layers 15. Then, an interlayer insulation film, a plug electrode, a wiring layer, and a protection film are formed to produce a flash memory according to one embodiment.

Figure 8:
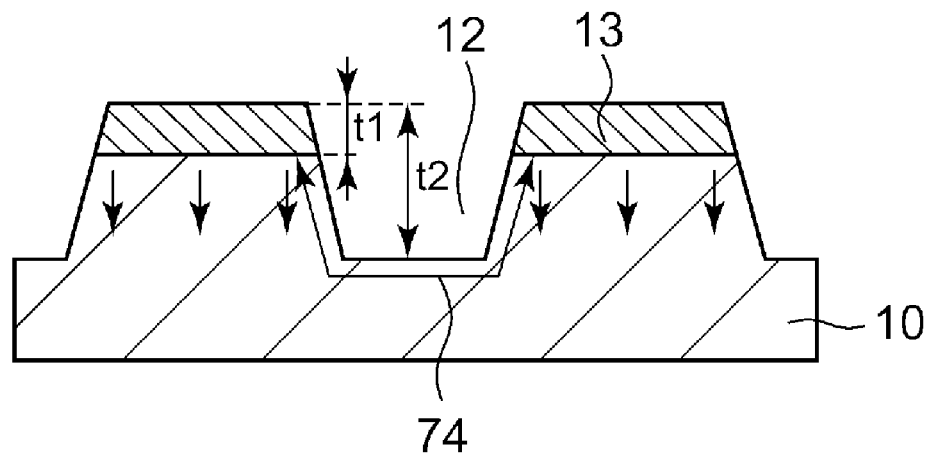
FIGS. 8A and 8B are explanatory views showing the effect derived from the third embodiment.
Figure 8:
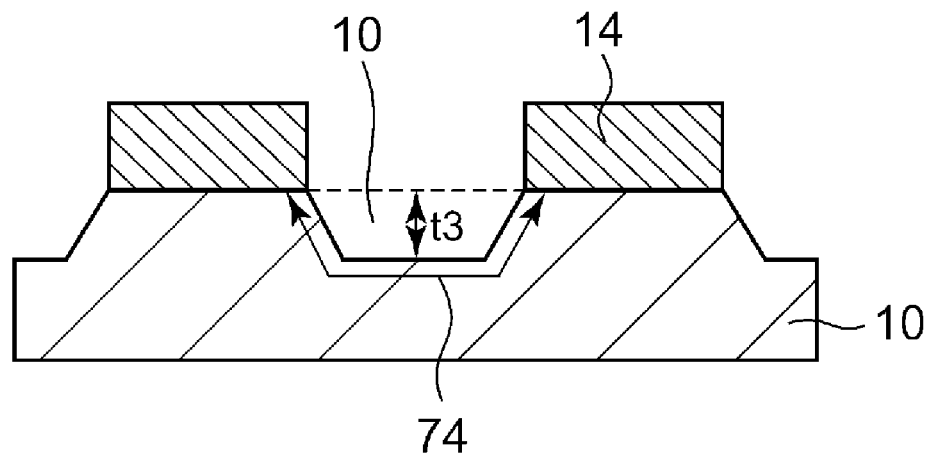

The effect derived from the semiconductor device according to one embodiment will be described referring to FIGS. 8A and 8B. In the flash memory having a groove, the ion is implanted into the semiconductor substrate 10 to form the bit line 13 as shown in FIG. 8A such that the groove 12 is formed in the semiconductor substrate 10. The bit line 13 is required to be highly doped for the purpose of lowering resistance of the bit lie 14. As a result, the bit line 13 extends in the longitudinal direction to increase a height t1 of the bit line 13. Accordingly, a depth t2 of the groove 12 has to be further increased to maintain a channel length 74 while miniaturizing the memory cell. As a result, the depth t2 of the groove 12 is likely to vary, thus causing the channel length 74 to fluctuate. The stress is concentrated on each corner of the upper portion and the lower portion of the groove 12 to cause leak current. It is therefore difficult to miniaturize the memory cell while maintaining the channel length 74.

Meanwhile, according to this embodiment, the bit line 14 is formed inside the epitaxial semiconductor layer 15 on the semiconductor substrate 10. A depth t3 of the groove 12 formed in the semiconductor substrate 10, and thus, is small as shown in FIG. 8B. This makes it possible to suppress fluctuation in the channel length 74 caused by the variation in the depth t3 of the groove 12. This makes it possible to miniaturize the memory cell while maintaining the channel length 74.

Likewise, this embodiment provides a memory having the groove 12 formed in the semiconductor substrate 10 and the ONO film formed along the inner surface of the groove 12 to suppress the fluctuation in the channel length. This makes it possible to maintain the channel length 74 while miniaturizing the memory cell. The polymer layer (filling layer) 42 for filling the groove 12 is formed as shown in FIG. 6C. Then, the epitaxial semiconductor layer 15 is formed using the polymer layer 42 as a mask as shown in FIG. 6D. This makes it possible to selectively form the epitaxial semiconductor layer 15 on the semiconductor substrate 10 between the grooves 12.

Figure 9:
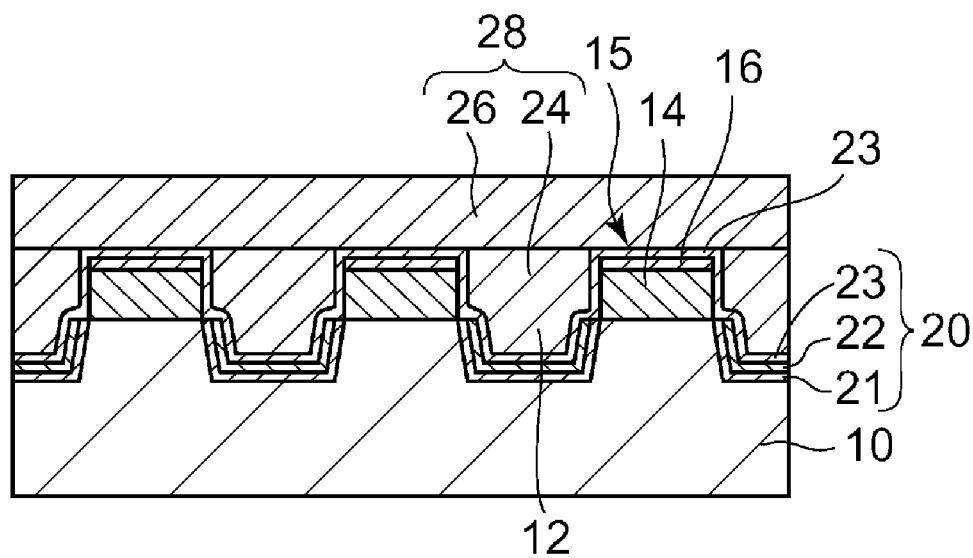
FIG. 9 is a sectional view taken along line A-A shown in FIG. 1A showing a manufacturing step of a flash memory according to a fourth embodiment.

Another embodiment includes a metal silicide layer 16 that is formed on the bit line 14. Referring to FIG. 9, the silicide layer 16 may be formed on the bit line 14 according to a previous embodiment. This makes it possible to lower the resistance of the bit line.

Figure 10:
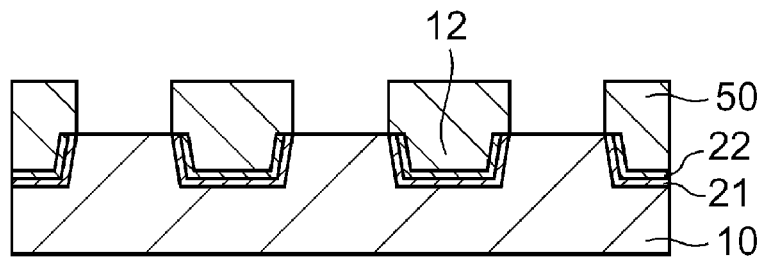
FIGS. 10A to 10D are sectional views taken along line A-A shown in FIG. 1A showing manufacturing steps of a flash memory according to a fifth embodiment.
Figure 10:
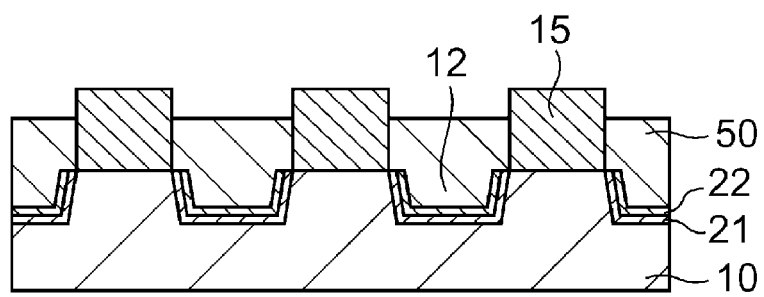
Figure 10:
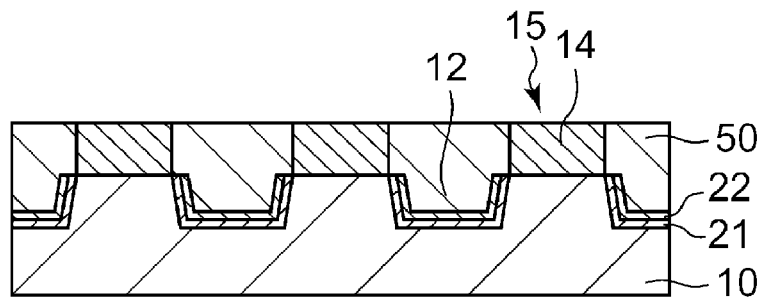
Figure 10:
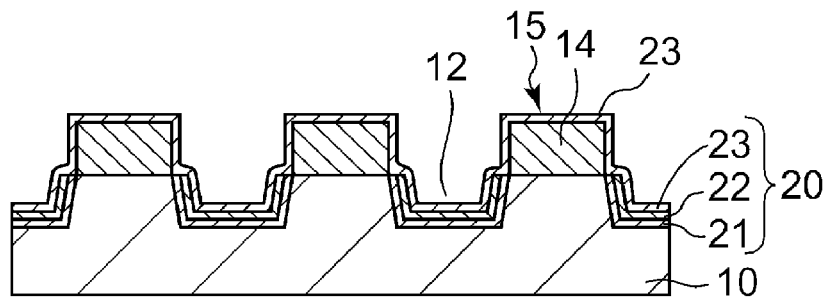

A still further embodiment comprises an epitaxial semiconductor layer that is formed using the mask layer as a mask. The polymer layer 42 is eliminated in the step shown in FIG. 6C according to a previous embodiment, and then a mask layer 50 as an insulator of the silicon oxide or the silicon nitride is formed on the groove as shown in FIG. 10A. Referring to FIG. 10B, the epitaxial semiconductor layer 15 is formed using the mask layer 50 as the mask such that the upper surface of the epitaxial semiconductor layer 15 is higher than that of the mask layer 50. Referring to FIG. 10C, the epitaxial semiconductor layer 15 and the mask layer 50 are polished so that the respective upper surfaces thereof become flat. Ion implantation is performed such that the bit line 14 is formed inside the epitaxial semiconductor layer 15. Referring to FIG. 10D, the mask layer 50 is eliminated to form the top oxide film 23 on the trap layer 22 inside the groove 12 and the epitaxial semiconductor layer 15.

According to this embodiment, the mask layer 50 is formed on the region corresponding to the area between the epitaxial semiconductor layers as shown in FIG. 10A. The epitaxial semiconductor layer 15 is formed using the mask layer 50 as the mask as shown in FIG. 10B such that the upper surface of the epitaxial semiconductor layer 15 is higher than that of the mask layer. Referring to FIG. 10C, the epitaxial semiconductor layer 15 is polished to be in the same plane with the mask layer 50. In the first to the fourth embodiments, because the side surface of the epitaxial semiconductor layer 15 is not defined, the side surface may be diagonally formed. In the fifth embodiment, the side surface configuration of the epitaxial semiconductor layer 15 may be defined by the side surface of the mask layer 50. For example, assuming that the side surface of the mask layer 50 is substantially perpendicular to the semiconductor substrate 10, the side surface of the epitaxial semiconductor layer 15 may also be substantially perpendicular. The embodiment allows the angle of the side surface of the epitaxial semiconductor layer 15 to be defined to a desired value.

In this embodiment, the epitaxial semiconductor layer 15 may be formed to have its upper surface lower than that of the mask layer 50. Also in this case, the side surface of the epitaxial semiconductor layer 15 that is in contact with the mask layer 50 can be defined by the mask layer 50.

Figure 11A:
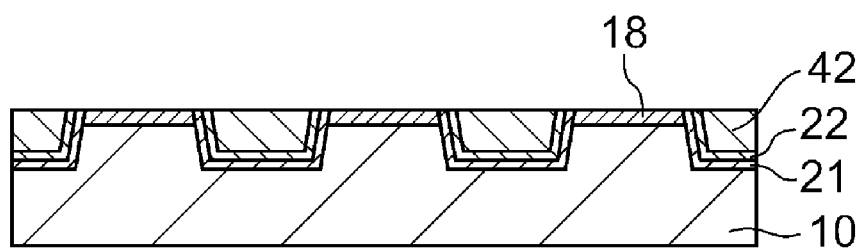
FIGS. 11A and 11B are sectional views taken along line A-A shown in FIG. 1A showing manufacturing steps of a flash memory according to a sixth embodiment.
Figure 11B:
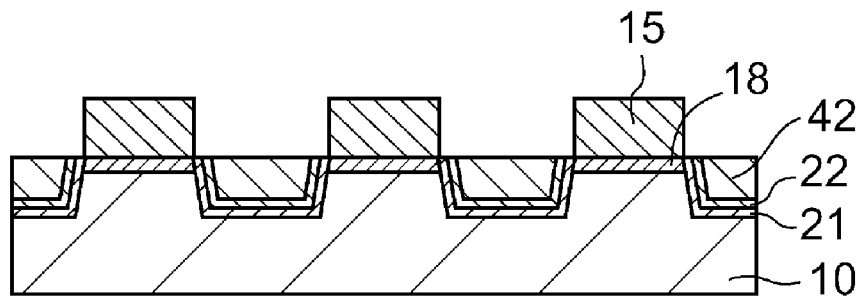
Figure 12:
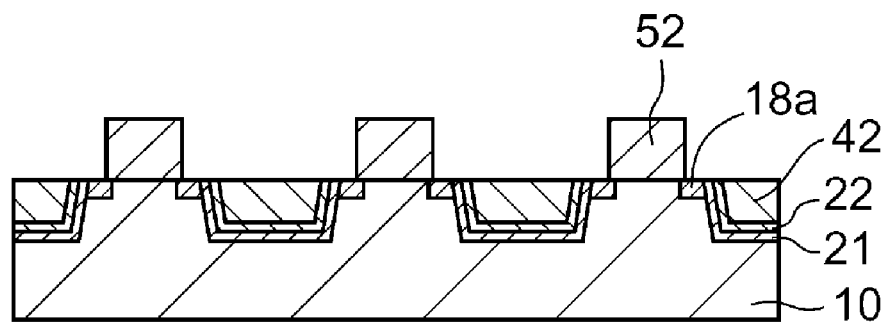
FIG. 12 is a sectional view taken along line A-A shown in FIG. 1A showing a manufacturing step of a flash memory (part 1) according to a seventh embodiment.

Pocket implantation using boron and the like may be performed for the region of the semiconductor substrate 10 corresponding to the area between the epitaxial semiconductor layers to form a p-type pocket implantation region 18 as shown in FIG. 11A. Referring to FIG. 11B, the epitaxial semiconductor layer 15 is epitaxially grown on the semiconductor substrate 10. Thereafter, the steps subsequent to the step shown in FIG. 7A according to the third embodiment are performed to produce a flash memory according to this embodiment.

The pocket implantation region 18 is formed between the channel and the bit line 14 in contact with the bit line 14 as a doped p-type region higher than the channel (semiconductor substrate 10). This makes it possible to increase the electric field in the region between the channel and the bit line 14 so as to improve the property for writing and deleting the charge into or from the trap layer 22.

In another embodiment, the pocket implantation region is formed adjacent to the groove. A photoresist 52 is formed on the semiconductor substrate 10 between the grooves 12. The photoresist 52 is formed on the center of the region corresponding to the area between the epitaxial semiconductor layers rather than being formed at the ends of the region. The ion implantation using boron and the like allows a pocket implantation region 18a to be formed on the region of the semiconductor substrate 10 adjacent to the groove 12 between the epitaxial semiconductor layers.

Figure 13:
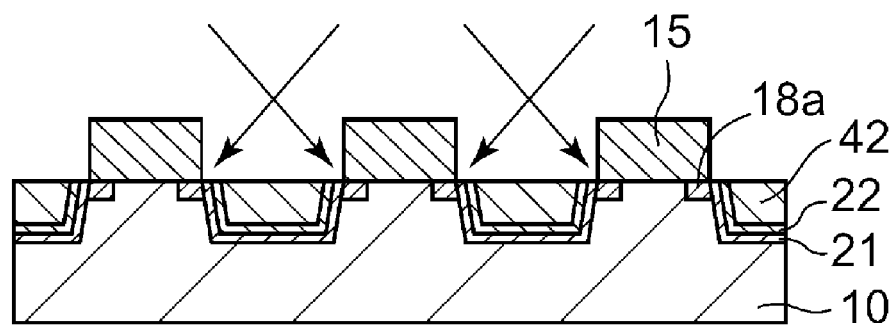
FIG. 13 is a sectional view taken along line A-A shown in FIG. 1A showing the manufacturing step of the flash memory (part 2) according to the seventh embodiment.

As shown in FIG. 13, boron and the like is diagonally implanted. This forms the pocket implantation region 18a in the semiconductor substrate 10 below the epitaxial semiconductor layer 15. The pocket implantation region 18a may be formed in contact with the bit line 14 in the semiconductor substrate 10 adjacent to the groove 12 between the epitaxial semiconductor layers 15.

Figure 14:
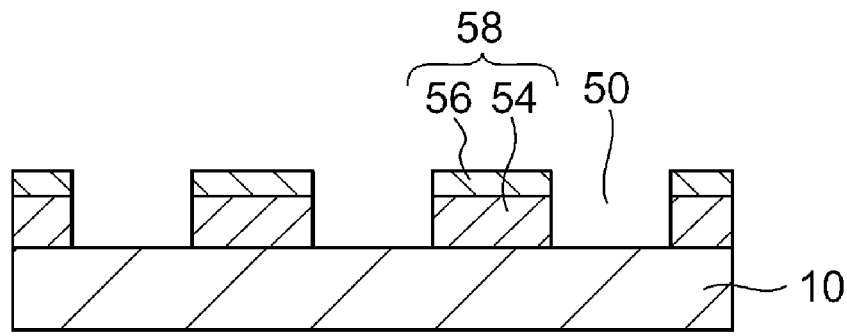
FIGS. 14A to 14D are sectional views taken along line A-A shown in FIG. 1A showing manufacturing steps of a flash memory (part 1) according to an eighth embodiment.
Figure 14:
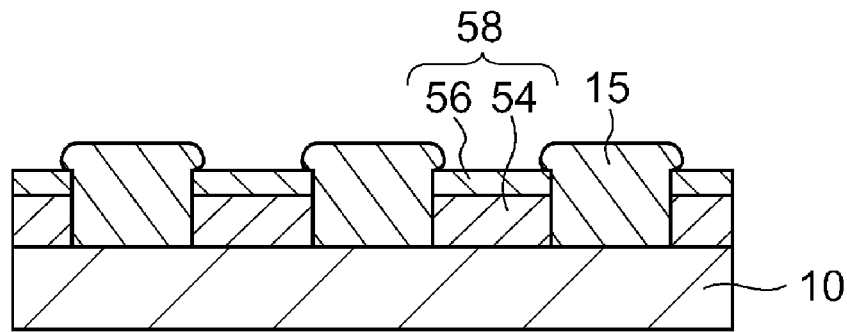
Figure 14:
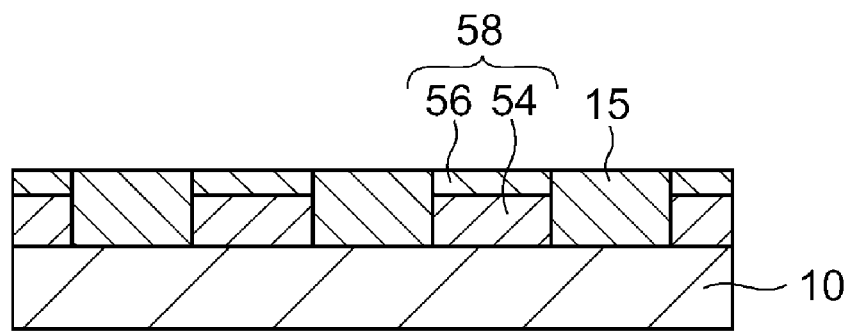
Figure 14:
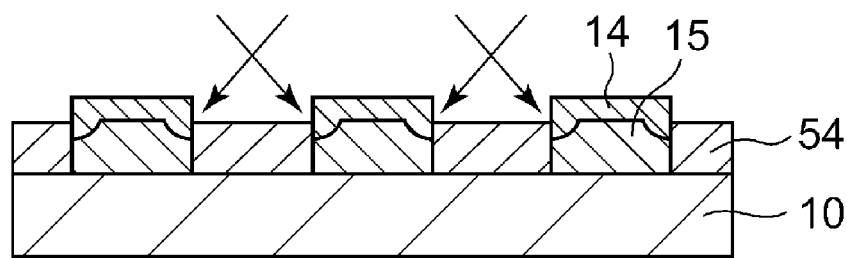

In a still further embodiment, the bit line is formed at the upper portion of the epitaxial semiconductor layer. Referring to FIG. 14A, a lower mask layer 54 of silicon oxide and a polish stopper layer 56 of silicon nitride are formed as the mask layer 58 on the region corresponding to the area between the epitaxial semiconductor layers. Referring to FIG. 14B, the epitaxial semiconductor layer 15 is formed using the mask layer 58 as a mask such that the upper surface of the epitaxial semiconductor layer 15 is higher than that of the mask layer 58. Referring to FIG. 14C, the epitaxial semiconductor layer 15 is polished using the CMP process. Because the polish stopper layer 56 of silicon nitride is unlikely to be polished compared with the epitaxial semiconductor layer 15, polishing may be stopped at the upper surface of the polish stopper layer 56. Referring to FIG. 14D, the polish stopper layer 56 is eliminated using phosphoric acid. The diagonal implantation of As (and the like) forms the bit line 14 as the n-type diffusion layer on the epitaxial semiconductor layer 15.

Figure 15:
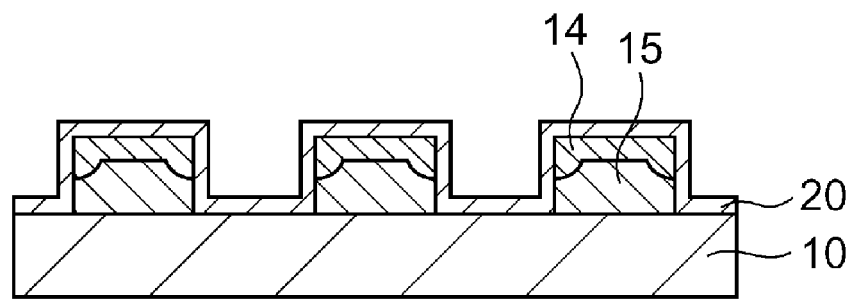
FIGS. 15A and 15B are sectional views taken along line A-A shown in FIG. 1A showing the manufacturing steps of the flash memory (part 2) according to the eighth embodiment.
Figure 15:
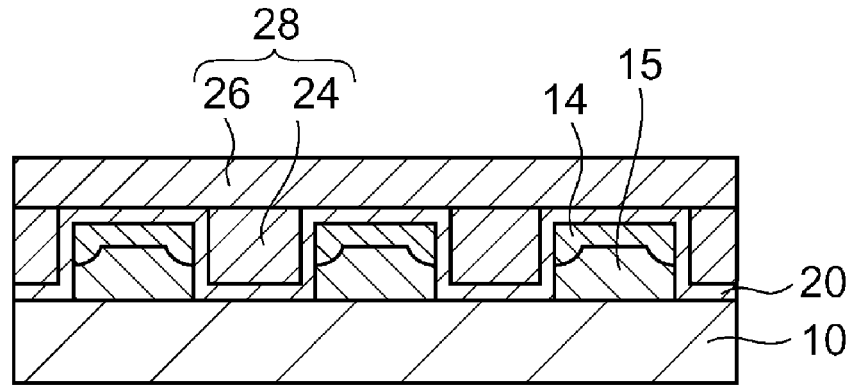

Referring to FIG. 15A, the lower mask layer 54 is eliminated. Then, the ONO film 20 is formed to coat the upper surface of the semiconductor substrate 10 and the epitaxial semiconductor layer 15. Referring to FIG. 15B, the word line 28 formed of the first and the second polysilicon layers 24 and 26 is formed. Thereafter, an interlayer insulation film, a plug electrode, a wiring layer and a protection film are formed to produce a flash memory according to the eighth embodiment.

According to one embodiment, the ONO film 20 is formed also on the sides of the epitaxial semiconductor layer 15 as shown in FIG. 15A. The side portion of the epitaxial semiconductor layer 15 and the upper surface of the semiconductor substrate 10 may form a channel without forming a groove in the semiconductor substrate 10. This can further improve controllability of the channel length.

Referring to FIG. 14A, the lower mask layer 54 and the polish stopper layer 56 are formed as the mask layer 58. Thus, as shown in FIG. 14C, the epitaxial semiconductor layer 15 can be polished to be in the same plane with the polish stopper layer 56. This can improve controllability of the film thickness of the epitaxial semiconductor layer 15.

Referring to FIG. 14D, the polish stopper layer 56 is eliminated to leave the lower mask layer 54, and the ion is diagonally implanted in the presence of the lower mask layer 54 to form the bit line 14. Thus, it is possible to improve controllability of the depth where the bit line 14 is formed. The controllability of the channel length, thus, can further be improved.

As shown in FIGS. 8A and 8B, the depth of the bit line 14 is mainly controlled by implantation energy in the third embodiment. When the depth of the bit line 14 is selected to lower the resistance of the bit line 14, the carrier profile between the bit line 14 and the channel cannot be made sharp. In addition, the depth of the bit line 14 cannot be accurately controlled. Meanwhile, in the eighth embodiment, as the depth of the bit line 14 can be defined by the lower mask layer 54, the carrier profile between the bit line 14 and the channel can be made sharp. This may also improve controllability of the depth of the bit line 14.

Figure 16:
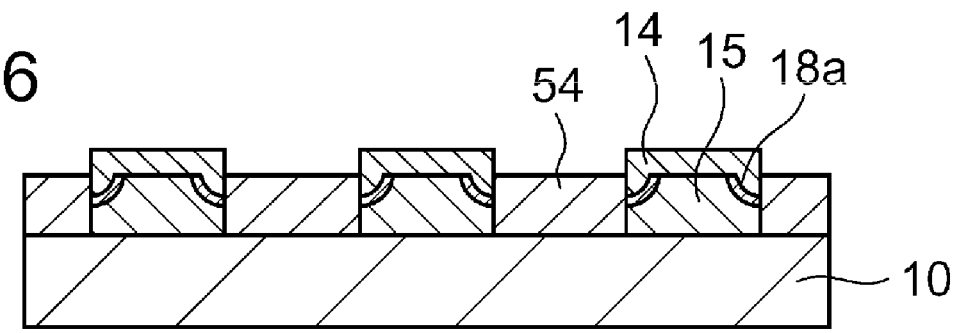
FIG. 16 is a sectional view taken along line A-A shown in FIG. 1A showing the manufacturing step of the flash memory according to the eighth embodiment.

Referring to FIG. 16, boron and the like may be diagonally implanted before performing the implantation to form the bit line 14 in the step shown in FIG. 14D so as to form the pocket implantation region 18a.

As described in the foregoing embodiments, the insulation film formed of silicon nitride is employed as the charge storage layer. However, another insulation film or a floating gate may also be employed.

Although the preferred embodiments of the present invention have been described, it is to be understood that the present invention is not limited to the above-described embodiments, and may be changed or modified into various forms without departing from the scope of the present invention.

The invention claimed is:

1. A semiconductor device comprising:
   a plurality of epitaxial semiconductor layers formed on a semiconductor substrate;
   a plurality of bit lines formed on upper portions of the plurality of epitaxial semiconductor layers;
   a charge storage layer formed on the semiconductor substrate between the plurality epitaxial semiconductor layers; and
   a mask layer on a region corresponding to the area between the plurality of epitaxial semiconductor layers,
   wherein the plurality of epitaxial semiconductor layers are formed using the mask layer as a mask,
   further wherein the plurality of epitaxial semiconductor layers are polished to be in the same plane with the mask layer.

2. The semiconductor device according to claim 1, wherein:
   a groove is formed in the semiconductor substrate between the plurality of epitaxial semiconductor layers; and
   the charge storage layer is formed along an inner surface of the groove.

3. The semiconductor device according to claim 1, wherein each of the plurality of epitaxial semiconductor layers is formed as a bit line.

4. The semiconductor device according to claim 1, wherein the charge storage layer is also formed on each side of the plurality of epitaxial semiconductor layers.

5. A method for manufacturing a semiconductor device comprising:
   forming a charge storage layer on a region of a semiconductor substrate corresponding to an area between a plurality of epitaxial semiconductor layers;
   forming the plurality of epitaxial semiconductor layers on the semiconductor substrate;
   forming a bit line on each upper portion of the plurality of epitaxial semiconductor layers;
   forming a mask layer on a region corresponding to the area between the plurality of epitaxial semiconductor layers, wherein the plurality of epitaxial semiconductor layers are formed using the mask layer as a mask; and
   polishing the plurality of epitaxial semiconductor layers to be in the same plane with the mask layer.

6. The method for manufacturing a semiconductor device according to claim 5, further comprising forming a groove in the region of the semiconductor substrate corresponding to the area between the plurality of epitaxial semiconductor layers, wherein the charge storage layer is formed along an inner surface of the groove.

7. The method for manufacturing a semiconductor device according to claim 5, wherein the plurality of epitaxial semiconductor layers are formed using the charge storage layer as a mask.

8. The method for manufacturing a semiconductor device according to claim 5, wherein the plurality of epitaxial semiconductor layers are formed to have each upper surface lower than an upper surface of the mask layer.

* * * * *